United States Patent [19]
Bae et al.

[11] Patent Number: 5,236,859
[45] Date of Patent: Aug. 17, 1993

[54] METHOD OF MAKING STACKED-CAPACITOR FOR A DRAM CELL SAME

[75] Inventors: Dong-Joo Bae, Seoul; Won-Shik Baek; Kyu-Hyun Choi, both of Seou, all of Rep. of Korea

[73] Assignee: SamSung Electronics Co., Ltd., Suwon, Rep. of Korea

[21] Appl. No.: 804,384

[22] Filed: Dec. 10, 1991

Related U.S. Application Data

[62] Division of Ser. No. 575,666, Aug. 31, 1990, Pat. No. 5,095,346.

[30] Foreign Application Priority Data

Jun. 5, 1990 [KR] Rep. of Korea ............... 8288/1990

[51] Int. Cl.⁵ .................................... H01L 21/70
[52] U.S. Cl. .......................... 437/52; 437/47; 437/60; 437/919
[58] Field of Search ............... 437/47, 48, 52, 60, 437/228, 233, 235, 919; 357/23.6, 51

[56] References Cited

U.S. PATENT DOCUMENTS

| | | | |
|---|---|---|---|
| 5,049,957 | 9/1991 | Inoue et al. | 437/52 |
| 5,068,698 | 11/1991 | Koyama et al. | 437/52 |
| 5,071,781 | 12/1991 | Seo et al. | 437/52 |

FOREIGN PATENT DOCUMENTS 0265556 10/1989 Japan.
0270343 10/1989 Japan.

OTHER PUBLICATIONS

S. Inoue, "A New Stacked Capacitor Cell with Trim Box Structured Storage Node," 21st Comf. Oda Solid State Devices and Materials Tokyo, 1989 pp. 141–144.

*Primary Examiner*—Tom Thomas
*Attorney, Agent, or Firm*—Robert E. Bushnell

[57] ABSTRACT

There is disclosed a stacked capacitor with high capacity which ensures structural stability in a DRAM cell and a method for manufacturing the same. The stacked-capacitor is of a hollow (or cylindrical) capacitor where both ends of several polysilicon layers which form a storage electrode are connected with each other. In construction, this inventive stacked-capacitor includes: a first polysilicon layer coupled to the source region so as to extend in parallel with surface of the substrate over the left and right sides of the source region; a bridge polysilicon layer, extending in the upward direction of the substrate from both ends of the first polysilicon layer; a dielectric film formed so as to contact with the surfaces of the bridge polysilicon layer, first polysilicon layer, second polysilicon layer; and a third polysilicon layer formed so as to contact with the surface of the dielectric film.

5 Claims, 6 Drawing Sheets

METHOD OF MAKING STACKED-CAPACITOR FOR A DRAM CELL SAME

This division of Ser. No. 575,666 filed Aug. 31, 1990, now U.S. Pat. No. 5,095,346.

BACKGROUND OF THE INVENTION

The present invention relates to a capacitor for a DRAM cell. More particularly, the present invention relates to a stacked-capacitor for a DRAM cell having a hollow storage electrode and to a method for manufacturing the same.

Since a semiconductor memory device, particularly a dynamic RAM (hereinafter referred to as a DRAM,) is structurally reduced in the capacity of its capacitors due to high integration, it is absolutely necessary to realize a capacitor having a sufficiently large capacity even if the size of its memory cells is made small.

As a method for increasing the capacity of a DRAM cell capacitor, there have been disclosed a trench capacitor and a stacked capacitor. The trench capacitor has a trench formed on the surface of a substrate and a storage electrode formed in the inner wall of the trench and then the trench is filled with plate electrodes. The stacked capacitor has storage electrodes stacked on the substrate and the capacity of a capacitor is increased by utilizing the surface area of the extended storage electrodes.

Although the trench capacitor structure enables its capacity to increase to a considerable degree on the limited surface area, it is difficult to achieve satisfactory insulation between neighboring trenches for high integration which narrows the distance between elements. In the case of stacked capacitor structure, however, it has the advantage of increasing its capacity as compared with the trenched structure because it has enough room for extension over the substrate.

FIG. 1 illustrates an improved conventional stacked capacitor structure. On the substrate where an element separating oxide film 2, a source region 3, a drain region 4, a word line 5, a bit line 10 and an insulating film 6 are formed, the capacitor illustrated in FIG. 1 is composed of a fin-shaped storage electrode 7 which makes contact with the source region 3, a dielectric film 8 and a plate electrode 9. In the upper front of the substrate 1, an element protecting film 11 of the DRAM cell is formed.

The fin-shaped storage electrode 7 is formed by alternatively stacking and etching the polysilicon and oxide films which are arranged in several layers and then removing all of the oxide films remaining between the layers. Thereafter, the dielectric film 8 and the plate electrode 9 are formed.

In such a conventional method, however, the wing parts 71, 72 of storage electrode 7 are apt to fall apart when the substrate 1 is soaked in oxide film etching solution to remove the oxide film between layers before the dielectric film 8 is formed. In other words, the connecting parts of those wing parts 71, 72 are weakened and thereby caused to hang down or to fall apart because they become loose for lack of a supporting layer after the oxide films between layers are all removed. Consequently, this not only lowers the reliability of the process but also sets limits to a method for manufacturing capacitors stacked in several layers.

SUMMARY OF THE INVENTION

It is therefore an object of the present invention to provide a stacked capacitor which ensures structural stability in a DRAM cell and a method for manufacturing the same.

Another object of the present invention is to provide a method for increasing the capacity of a DRAM cell capacitor.

In order to accomplish the aforesaid objects of the present invention, a stacked capacitor according to the present invention is characterized in that it is a hollow (or cylindrical) capacitor where both ends of several polysilicon layers which form a storage electrode are connected with each other.

BRIEF DESCRIPTION OF THE DRAWINGS

For a better understanding of the present invention and to show how the same may be carried into effect, reference will now be made, by way of example, to the accompanying diagrammatic drawings, in which.

DETAILED DESCRIPTION OF THE PREFERRED EMBODIMENT

Figure 1:
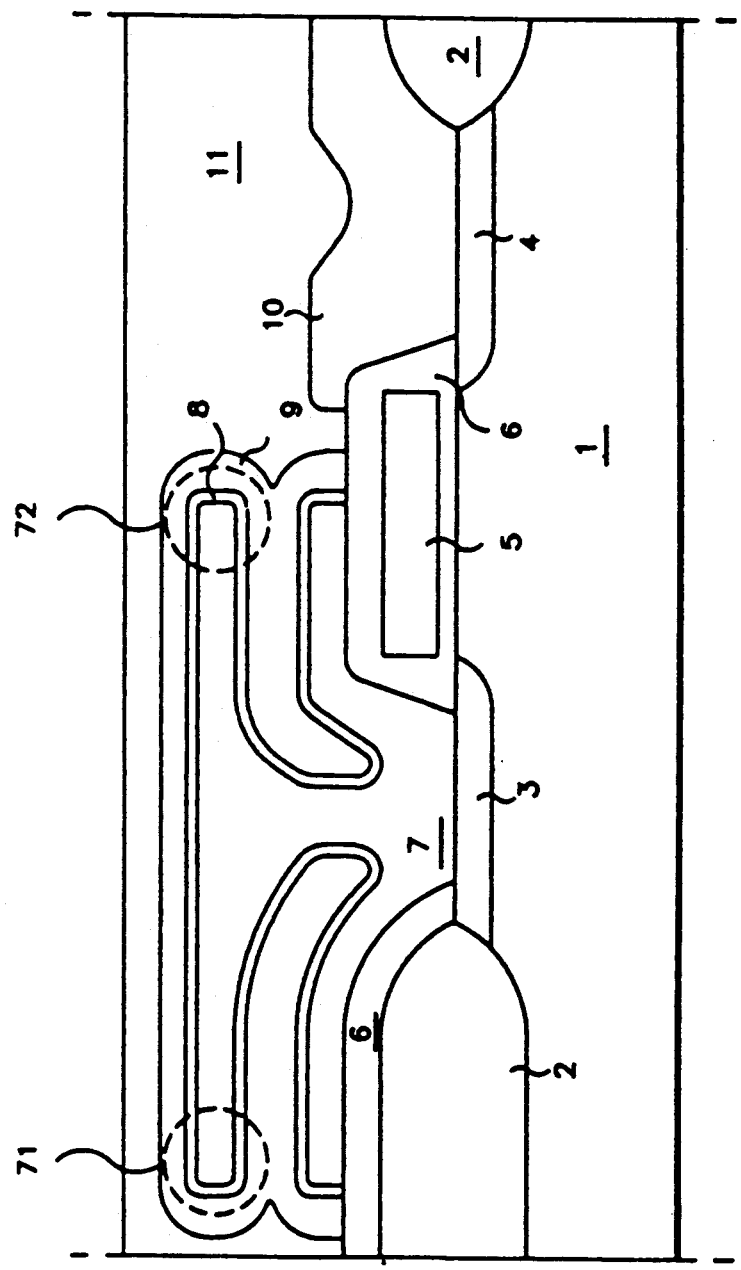
FIG. 1 is a cross-sectional structural view of a conventional DRAM cell.
Figure 2:
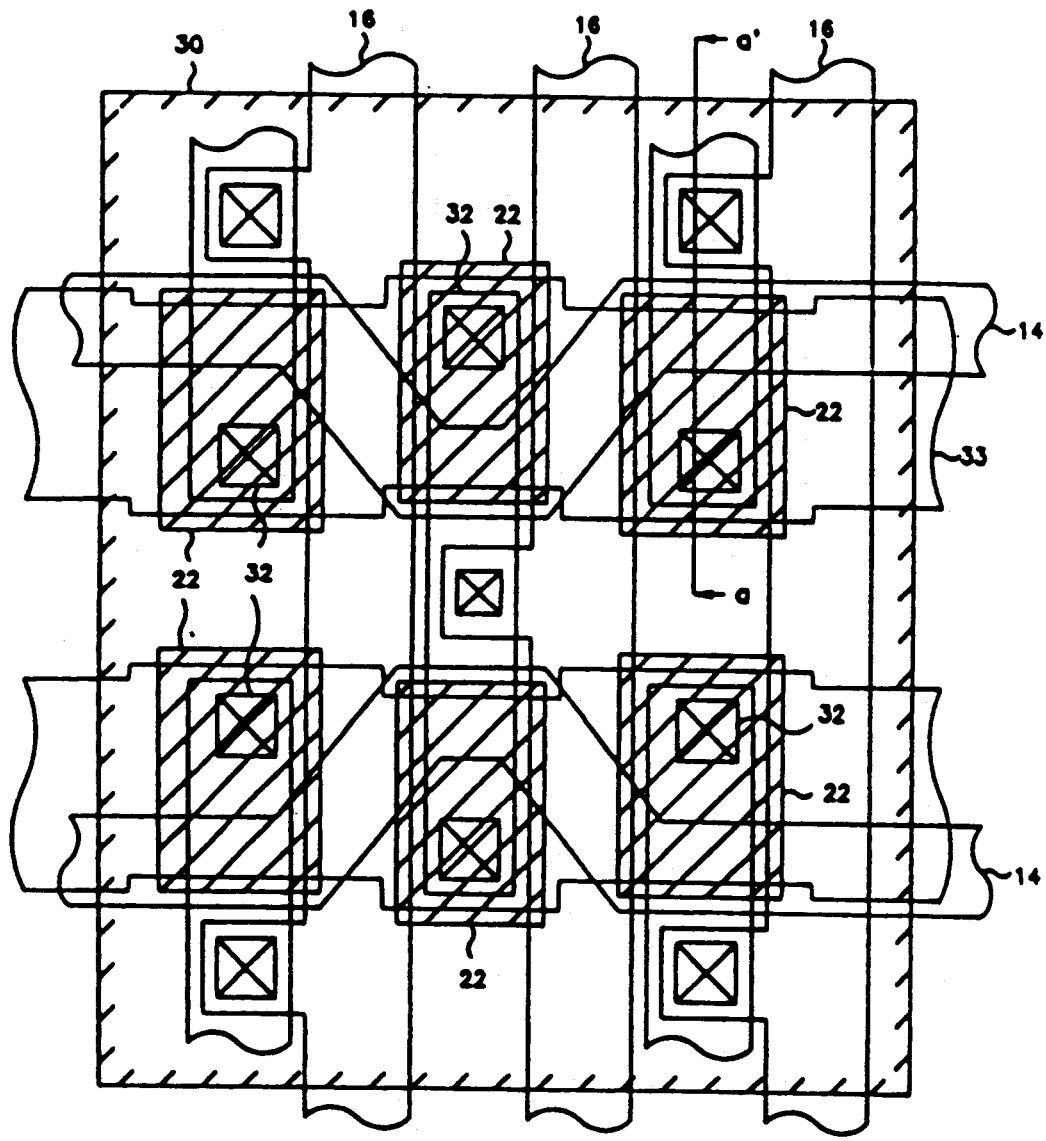
FIG. 2 is a plane view of a DRAM cell according to the present invention.

Referring to FIG. 2, a plane view of a DRAM cell having stacked capacitors according to the present invention, an active region 30 where there is formed a transistor's source region and drain region, a storage electrode 22 of the capacitor, a contact opening 32 which connects the source region and the storage electrode 22, a word line 14, a bit line 16 and a photoresistor pattern 33 are illustrated. The photoresistor pattern 33 is a mask pattern for connecting several polysilicon layers. It will be shown in the below mentioned manufacturing process. Although the form of a concrete storage electrode according to the present invention is illustrated in the aforesaid plane view, the part 34 where the photoresistor pattern 33 and the storage electrode 22 do not overlap becomes a part where several polysilicon layers are connected. Therefore, it is conjecturable that the storage electrode 22 assumes a cylindrical structure. The plate electrode which is not illustrated in FIG. 2 will have been formed in the interior and exterior of the storage electrode 22.

The structure of a capacitor of the present invention will be described hereinafter in conjunction with FIGS. 2 and 3, FIG. 3 being a cross-sectional view of a DRAM cell taken along the line a—a' of FIG. 2.

A semiconductor substrate 10 where an element separating oxide film 11, a transistor's source region 12 and drain region 13, word line 14 and a bit line 16 are formed, is coated with a layer insulating film 15 and a nitrifying film 17 in consecutive order. Here, the storage electrode 22 of the capacitor makes contact with the source region of the transistor and assumes the form of a cylinder (or the form of a hollow). In other words, it is composed of a first polysilicon layer 19 which makes contact with the source region 12 and extends in parallel with the semiconductor substrate 10 over the left and right sides of source region 12, a bridge polysilicon layer 23 which extends in the upward direction of substrate from both ends of the first polysilicon layer 19 and second polysilicon layer 21 which makes contact with the upper end of the bridge polysilicon layer 23 and extends in parallel with the first polysilicon layer 19.

In the interior and exterior of storage electrode 22 which is made up of the bridge polysilicon layers 23, the first polysilicon layers 19, and the second polysilicon layers 21, a dielectric film 24 and a plate electrode 25 are formed. Here, the bridge polysilicon layer 23 serves as a part 34 where several polysilicon layers are connected as illustrated in FIG. 2.

The structure of such a storage electrode 22 can use both its interior and exterior surrounded by the bridge polysilicon layers 19, the first polysilicon layers 23, and the second polysilicon layer 21 as the area of the capacitor and, as the wing parts of a fin are connected with each other between the upper and lower layers, structural stability can be promoted in the progress of the process.

FIGS. 4A to 4H are views showing processes necessary to manufacture a stacked capacitor according to the present invention. Now, a manufacturing method according to the present invention will be described by referring to FIGS. 4A to 4H.

Figure 4A:
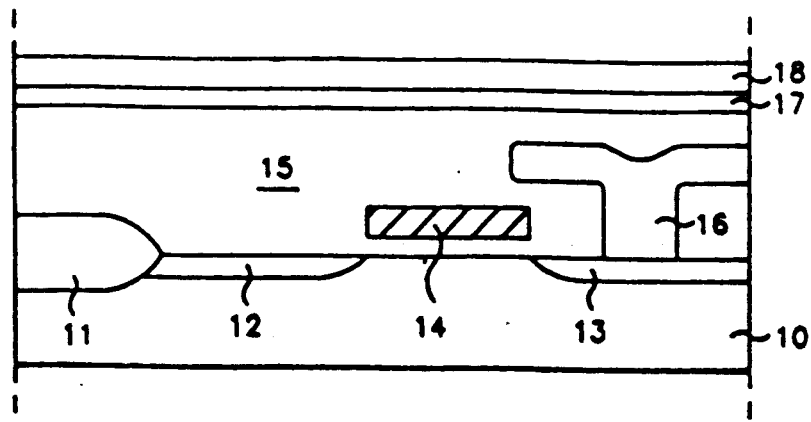
FIGS. 4A-4H show a manufacturing process of a DRAM cell according to the present invention.

First, as illustrated in FIG. 4A, after an element separating oxide film 11, a transistor's source region 12 and drain region 13, a word line 14 and a bit line 16 are formed on the substrate 10 of a semiconductor, the substrate 10 is coated with a layer insulating film 15 and a nitrifying film 17 and then with a first oxide film 18. Here, the nitrifying film 17 is used for etching suspension in a later process.

Figure 4B:
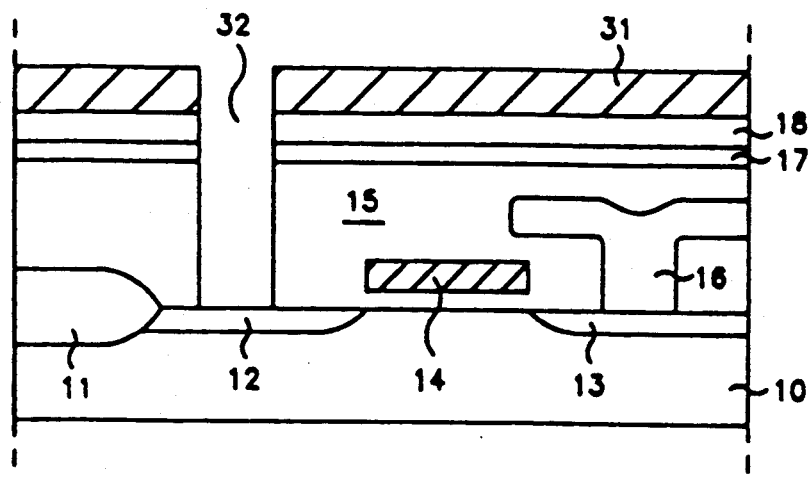

Next, in FIG. 4B, a first photoresistor pattern 31 is formed on the first oxide film 18 and then a first opening 32 which expose the surface of the source region 12 is formed by successively etching the first oxide film 18, nitrifying film 17 and layer insulating film 15 which are located on the source region 12.

Figure 4C:
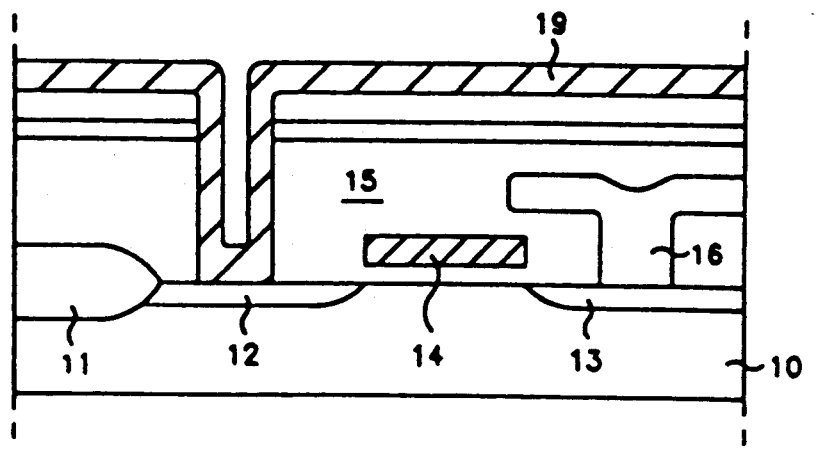

Thereafter, as illustrated in FIG. 4C, a first polysilicon layer 19 with a thickness of 500-2000Å is deposited over the whole surface of the substrate along the interior of the first opening 32 and the surface of the substrate.

Figure 4D:
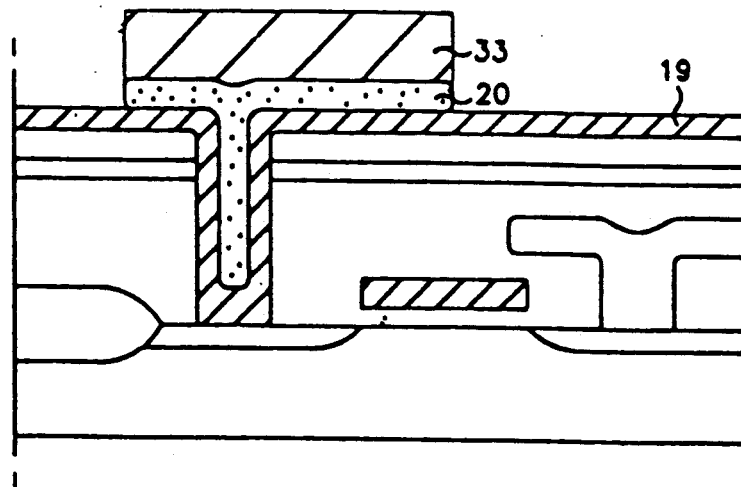

In FIG. 4D, a second oxide film 20 is formed on the whole surface of the substrate to the extent that the first opening 32 is filled. Then, a second photoresistor pattern 33 is formed on the second oxide film 20 and the second oxide film 20 which exists in the region excluding regions inclusive of the upside of the first opening 32, is selectively etched.

Figure 4E:
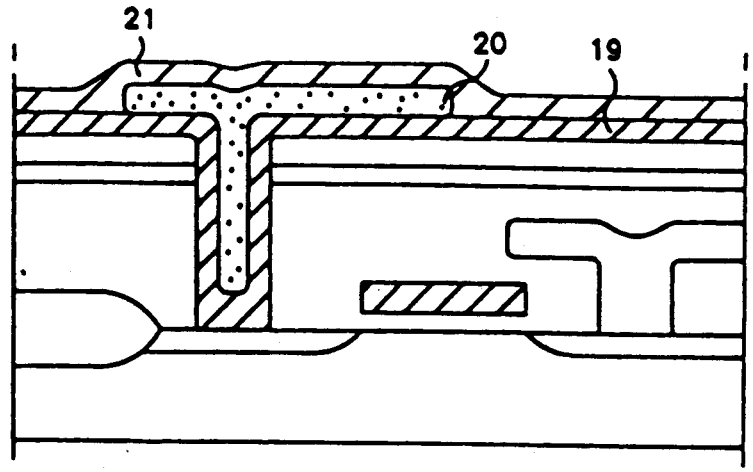

Next, in FIG. 4E, a second polysilicon layer 21 with the same thickness as the first polysilicon layer 19 is deposited on the whole surface of the substrate. At this time, the second polysilicon layer 21 makes contact with the first polysilicon later 19 in the remaining portion excluding a portion where the second oxide film 20 patterned in the process of FIG. 4D is formed.

Figure 4F:
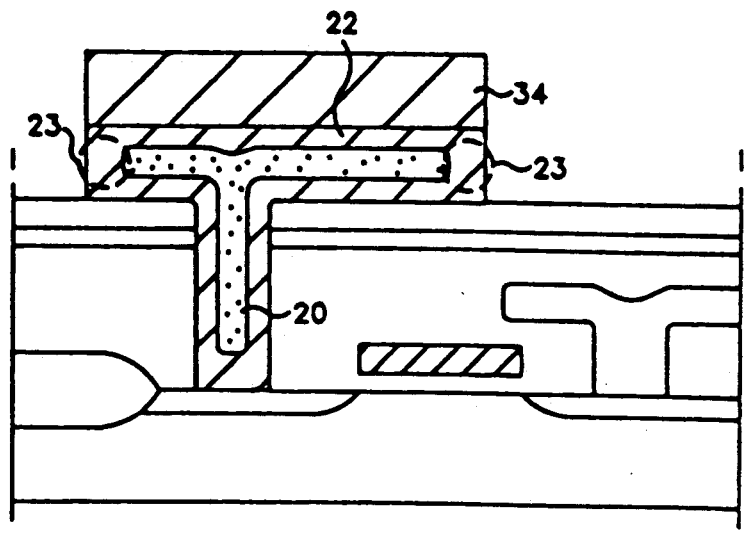

In FIG. 4F, a third photoresistor pattern 34 is formed on the second polysilicon layer 21 and then the second polysilicon layer 21 which exists in the remaining portion, excluding an adjacent portion on the surface and left/right sides of the second oxide film 20, is selectively etched. Here, the third photoresistor pattern 34 is a pattern which forms a storage electrode and so it must be coated more widely than the first photoresistor pattern 33. When the selective etching of the second polysilicon layer 21 is finished, a bridge polysilicon layer 23 where the first and second polysilicon layers 19, 21 are connected is formed in the portion contiguous to both ends of the second oxide film 20, as is illustrated in FIG. 4F. This is the same region as the region 34 illustrated as a plane view of the FIG. 2. In the result, the second polysilicon layer 21 and the first polysilicon layer 19, including the bridge polysilicon layer 23 will form a storage electrode 22.

Figure 4G:
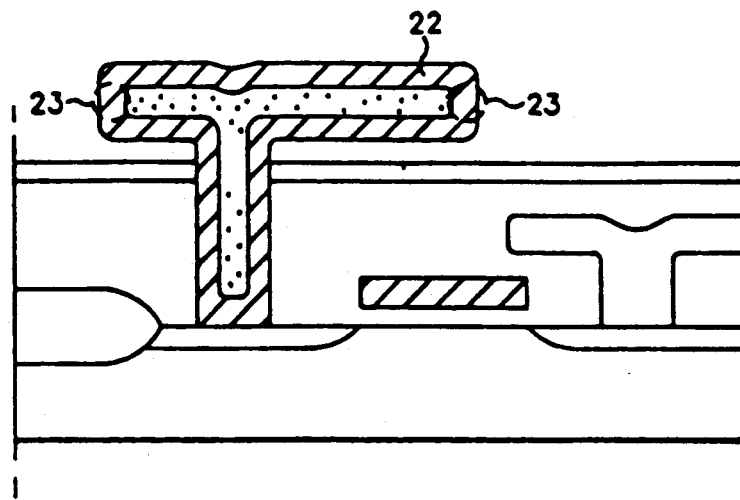

Next, in FIG. 4G, all of the remaining first and second oxide films 18, 20 are removed from the substrate by soaking it in an oxide etching solution. As illustrated, the storage electrode 22 cleared of oxide films assumes the structure of an empty cylinder. Accordingly, it is structurally stabilized so as not to cause a defect as seen in the fin structure without a bridge polysilicon layer 23 like the conventional structure. At this time, the nitrifying film 17 must be prevented from etching the layer insulating film 15 beneath it.

Figure 4H:
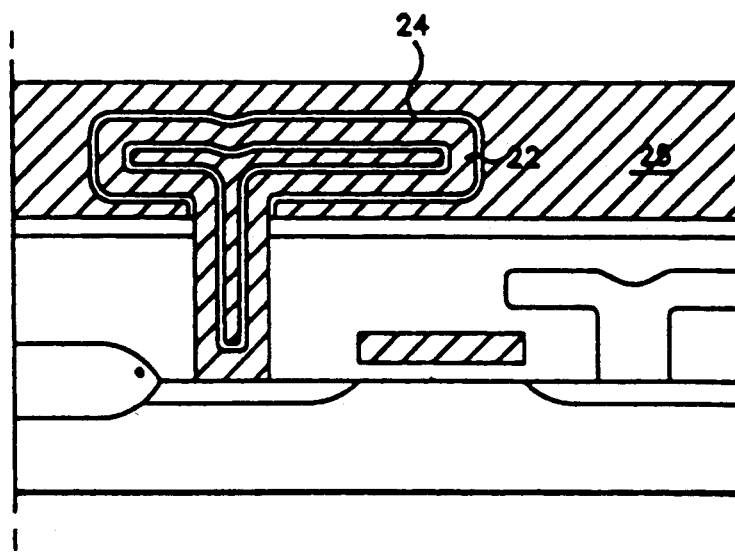

Next, in FIG. 4H, a dielectric film 24 is formed in the interior and exterior surfaces of the storage electrode 22 and then a stacked capacitor is completed by depositing third polysilicon layer 25 which serves as a plate electrode of the capacitor. Here, a silicon oxide or an ONO (Oxide-Nitride-Oxide) film can be used as a dielectric film.

Figure 3:
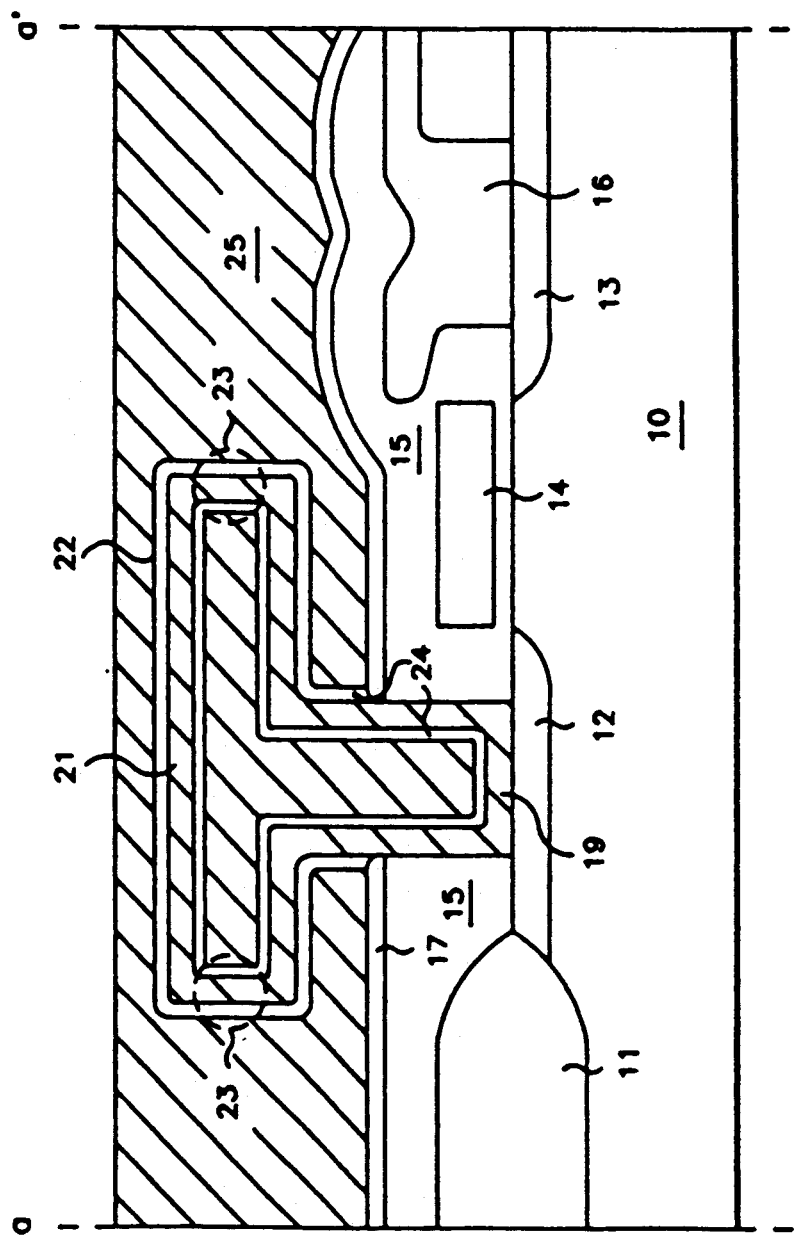
FIG. 3 is a cross-sectional structural view of a DRAM cell according to the present invention.

Although the formation of only one capacitor is illustrated in the process view of FIG. 3, which shows an embodiment of the present invention, those who are ordinarily skilled in this field can easily understand that several capacitors can be manufactured at the same time after a number of transistors are manufactured on the one semiconductor substrate. Since a storage electrode can be arranged in more than three layers, not to mention a memory device of more than 64 mega bit semiconductor memory, according to the aforesaid manufacturing method of the present invention, it is easy to realize a capacitor of large capacity in a highly integrated memory device.

As described hereinabove, the present invention has the effect of solving a problem of conventional fin structure which causes a defect in the manufacturing process by forming a storage electrode into an emptied cylindrical shape in a stacked capacitor of a DRAM cell having storage electrodes arranged in several layers.

Moreover, the present invention has the advantage of improving DRAM cell manufacturing reliability since it is not only structurally stabilized but also able to manufacture a capacitor of large capacity.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A process for manufacturing a stacked capacitor of a DRAM cell on a semiconductor substrate where an element separating oxide film, a source region and a drain region are formed, comprising the steps of:

coating said semiconductor substrate with a layer insulating film, a nitrified film and a first oxide film after a bit line is formed thereon;

forming a contact opening which exposes the surface of said source region by etching in consecutive order the first oxide film, nitrified film and layer insulating film on said source region;

depositing a first polysilicon layer on the whole surface of the substrate;

coating the surface of said polysilicon layer with a second oxide film to an extent that said contact opening is filled, and selectively etching said oxide film in a remaining portion excluding an upside of said contact opening;

depositing a second polysilicon layer on the whole surface of said substrate;

selectively etching the first and second polysilicon layers in a remaining portion excluding a portion where said first polysilicon layer contacts with said second polysilicon layer;

removing said first and second oxide films;

forming a dielectric film on the exposed surfaces of said first and second polysilicon layers; and forming a third polysilicon layer on the surface of said dielectric film.

2. A method according to claim 1, wherein said first polysilicon layer contacts with said second polysilicon layer in the portion adjacent to both ends of said second oxide film in said step of selectively etching the first and second polysilicon layers.

3. A method according to claim 1, wherein said first and second polysilicon layers serve as a storage electrode of the capacitor.

4. A method according to claim 1, wherein said third polysilicon layer serves as a plate electrode of the capacitor.

5. A method according to claim 2, wherein said first and second polysilicon layers serve as a storage electrode of the capacitor.

* * * * *

UNITED STATES PATENT AND TRADEMARK OFFICE
CERTIFICATE OF CORRECTION

PATENT NO. 5,236,859

DATED August 17, 1993

INVENTOR(S) : Dong-Joo Bae, et al.

It is certified that error appears in the above-identified patent and that said Letters Patent is hereby corrected as shown below:

On the title page, item (54) and column 2:

IN THE TITLE replace "METHOD OF MAKING STACKED-CAPACITOR FOR A DRAM CELL SAME"

with --METHOD OF MAKING STACK-CAPACITOR FOR A DRAM CELL--;

Column 1,

Line 1, replace "METHOD OF MAKING STACKED-CAPACITOR FOR A DRAM CELL SAME"

with --METHOD OF MAKING STACKED-CAPACITOR FOR A DRAM CELL--;

UNITED STATES PATENT AND TRADEMARK OFFICE
CERTIFICATE OF CORRECTION

PATENT NO. : 5,236,859
DATED : 17 August 1993
INVENTOR(S) : Dong-Joo Bae, et al.

It is certified that error appears in the above-identified patent and that said Letters Patent is hereby corrected as shown below:

Line 15, after "DRAM", delete the comma; and after "DRAM)", insert a comma;

Line 42, after "On the substrate", insert --1--;

Column 3:

change "layers 23" to --layers 19--;

Line 50, after "in the region", insert --,--;

Signed and Sealed this

Thirtieth Day of August, 1994

Attest:

BRUCE LEHMAN

Attesting Officer

Commissioner of Patents and Trademarks